(12) United States Patent
Maehata (10) Patent No.: US 9,887,704 B2
(45) Date of Patent: Feb. 6, 2018

(54) METHOD OF MANUFACTURING DISTORTION COMPENSATION APPARATUS

(71) Applicant: SUMITOMO ELECTRIC INDUSTRIES, LTD., Osaka-shi, Osaka (JP)

(72) Inventor: Takashi Maehata, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 15/307,489

(22) PCT Filed: Feb. 26, 2015

(86) PCT No.: PCT/JP2015/055528
§ 371 (c)(1),
(2) Date: Oct. 28, 2016

(87) PCT Pub. No.: WO2015/174119
PCT Pub. Date: Nov. 19, 2015

(65) Prior Publication Data
US 2017/0063391 A1 Mar. 2, 2017

(30) Foreign Application Priority Data
May 13, 2014 (JP) .................. 2014-099858

(51) Int. Cl.
*H03M 3/00* (2006.01)
*H03M 3/02* (2006.01)
*H04L 27/36* (2006.01)

(52) U.S. Cl.
CPC ............. *H03M 3/358* (2013.01); *H03M 3/02* (2013.01); *H03M 3/43* (2013.01); *H04L 27/36* (2013.01)

(58) Field of Classification Search
CPC ...... H03M 3/352; H03M 3/388; H03M 3/424; H03M 3/502; H03M 1/002; H03M 1/06;
(Continued)

(56) References Cited

U.S. PATENT DOCUMENTS 5,815,585 A * 9/1998 Klippel .............. H03H 21/0001
381/59
6,426,926 B1 * 7/2002 Sonu ................. G11B 20/10009
369/124.05
(Continued)

FOREIGN PATENT DOCUMENTS

JP 2003-110376 A 4/2003
JP 2004-015364 A 1/2004
(Continued)

OTHER PUBLICATIONS

Takashi Maehata, et al., "A Novel 1-bit Feedforward Distorted Compensation for Bandpass ΔΣ Modulation", IEICE Technical Report, Oct. 10, 2012 (Oct. 10, 2012), vol. 112, No. 240, pp. 165-172.
(Continued)

*Primary Examiner* — Linh Nguyen
(74) *Attorney, Agent, or Firm* — Drinker Biddle & Reath LLP (57) ABSTRACT

A distortion compensator 10 acquires an asymmetric component included in a 1-bit pulse train outputted from a DSM 6 on the basis of an analog signal as an output signal obtained from the 1-bit pulse train, and an IQ signal as an input signal to be inputted to the DSM 6, and performs distortion compensation on the basis of the asymmetric component. The distortion compensator 10 is caused to store therein asymmetric component data representing the acquired asymmetric component. When acquiring the asymmetric component, the distortion compensator 10 acquires, as an asymmetric component, a difference between an output
(Continued)

baseband signal obtained by orthogonally demodulating the analog signal as the output signal, and an input baseband signal before being orthogonally modulated.

5 Claims, 9 Drawing Sheets

(58) Field of Classification Search
CPC ...... H03M 1/1038; H03M 1/12; H03M 1/181; H03M 1/183; H03M 1/186; H03M 1/208; H03M 1/504; H03M 1/822; H03M 3/506
USPC .................................. 341/118, 120, 143, 144
See application file for complete search history.

(56) References Cited

U.S. PATENT DOCUMENTS

| | | | | |
|---|---|---|---|---|
| 7,359,519 | B2* | 4/2008 | Lee | H04R 3/002 |
| | | | | 381/59 |
| 8,477,581 | B1* | 7/2013 | Liu | G11B 20/10027 |
| | | | | 369/59.15 |
| 9,516,443 | B2* | 12/2016 | Risberg | H04R 3/002 |
| 2004/0046680 | A1* | 3/2004 | Masuda | H03F 3/217 |
| | | | | 341/143 |
| 2005/0094539 | A1* | 5/2005 | Minemura | G11B 20/10046 |
| | | | | 369/112.23 |
| 2007/0296495 | A1* | 12/2007 | Shako | H03F 1/3247 |
| | | | | 330/149 |
| 2008/0278361 | A1* | 11/2008 | Lee | H03K 7/08 |
| | | | | 341/143 |
| 2008/0297382 | A1* | 12/2008 | Risbo | G10L 19/10 |
| | | | | 341/53 |
| 2010/0329482 | A1* | 12/2010 | Lee | H03G 3/002 |
| | | | | 381/104 |
| 2011/0279176 | A1* | 11/2011 | Oran | H01P 1/20336 |
| | | | | 327/553 |
| 2015/0015427 | A1 | 1/2015 | Maehata | |
| 2015/0103945 | A1* | 4/2015 | Maehata | H04L 25/49 |
| | | | | 375/295 |

FOREIGN PATENT DOCUMENTS

| | | |
|---|---|---|
| JP | 2014-014059 A | 1/2014 |
| JP | 2014-042209 A | 3/2014 |

OTHER PUBLICATIONS

Takashi Maehata, et al., "Estimation method for an asymmetric waveform in 1-bit digital RF transmitter", IEICE Technical Report, May 15, 2014 (May 15, 2014), vol. 114, No. 44, pp. 103-109.

* cited by examiner

Eye pattern

FIG. 2B

Sout(t)

FIG. 2C

SIdeal(t)

FIG. 2D fsymm(t)

FIG. 2E fasym(t)

FIG. 3A

Eye pattern

FIG. 3B

Sout(t)

FIG. 3C

SIdeal(t)

FIG. 3D fsymm(t)

FIG. 3E fasym(t)

METHOD OF MANUFACTURING DISTORTION COMPENSATION APPARATUS

TECHNICAL FIELD

The present invention relates to a method of manufacturing a distortion compensation apparatus. More particularly, the invention relates to a method of manufacturing a distortion compensation apparatus which performs distortion compensation on a signal conversion device for converting an input signal into a 1-bit pulse train representing an analog signal.

BACKGROUND ART

Delta-sigma modulation is an example of a technique for generating a 1-bit pulse train representing an analog waveform.

The delta-sigma modulation is a kind of oversampling modulation. A delta-sigma modulator includes a loop filter and a quantizer. The quantizer is able to output a 1-bit pulse train as a quantized signal.

The 1-bit pulse train outputted from the delta-sigma modulator is restored to the original analog waveform by simply passing through an analog filter. That is, the 1-bit pulse train outputted from the delta-sigma modulator is a digital signal, but represents an analog waveform, and therefore has both the property as a digital signal and the property as an analog signal.

It is conceivable to transmit an analog signal as a digital signal by utilizing the 1-bit pulse train having the aforementioned properties. In this case, however, degradation in signal characteristics of the analog signal due to utilization of the 1-bit pulse train has become a problem.

The inventors of the present invention have discovered that, in the 1-bit pulse train also having the property as an analog signal, asymmetry between a pulse rising waveform and a pulse falling waveform causes degradation in signal characteristics as the analog signal (refer to Patent Literature 1).

That is, if a distortion component (asymmetric component) that is included in the waveform of the 1-bit pulse train and causes asymmetry between the pulse rising waveform and the pulse falling waveform is suppressed, degradation in signal characteristics as the analog signal represented by the 1-bit pulse train can be suppressed.

CITATION LIST

Patent Literature

PATENT LITERATURE 1: Japanese Laid-Open Patent Publication No. 2014-14059

SUMMARY OF INVENTION

Technical Problem

In order to suppress the asymmetric component included in the waveform of the 1-bit pulse train, it is conceivable to extract the asymmetric component from the 1-bit pulse train, and generate a compensation signal for canceling the asymmetric component. By adding the compensation signal to the 1-bit pulse train, the asymmetric component included in the waveform of the 1-bit pulse train is suppressed, whereby degradation in signal characteristics as the analog signal represented by the 1-bit pulse train can be suppressed.

In order to extract the asymmetric component from the 1-bit pulse train, the following technique is conceivable. That is, the 1-bit pulse train is observed by means of a sampling oscilloscope, and an eye pattern thereof is obtained. Then, the asymmetric component is extracted from a rising waveform and a falling waveform in the obtained eye pattern.

However, noise is included in the eye pattern in the process of observing the eye pattern, and this noise prevents the asymmetric component from being accurately extracted, resulting in a problem that degradation in signal characteristics as the analog signal represented by the 1-bit pulse train cannot be effectively suppressed.

The present invention has been made in view of the above circumstances. An object of the present invention is to provide a method of manufacturing a distortion compensation apparatus capable of effectively suppressing degradation in signal characteristics as an analog signal represented by a 1-bit pulse train.

Solution to Problem

An embodiment of the present embodiment is a method of manufacturing a distortion compensation apparatus configured to perform distortion compensation on a signal conversion device which converts an input signal into a 1-bit pulse train. The 1-bit pulse train has a pulse rising waveform and a pulse falling waveform. The pulse rising waveform has a first distortion component with respect to an ideal pulse rising waveform, and the pulse falling waveform has a second distortion component with respect to an ideal pulse falling waveform. The method includes: an acquisition step of acquiring an asymmetric component which makes the first distortion component and the second distortion component, included in the 1-bit pulse train, asymmetrical with respect to a time axis, on the basis of the input signal, and an output signal obtained from the 1-bit pulse train outputted from the signal conversion device; and a storage step of causing the distortion compensation apparatus that performs distortion compensation on the basis of the asymmetric component to store therein the asymmetric component acquired in the acquisition step. The input signal is modulated and then converted into the 1-bit pulse train by the signal conversion device. In the acquisition step, a difference between an output baseband signal obtained by demodulating the output signal and an input baseband signal which is the input signal before being modulated is acquired as the asymmetric component.

Advantageous Effects of Invention

The method of manufacturing a distortion compensation apparatus according to the present invention provides a distortion compensation apparatus capable of effectively suppressing degradation in signal characteristics.

DESCRIPTION OF EMBODIMENTS

[Description of Embodiments of the Present Invention]

As described above, in order to suppress degradation in signal characteristics as the analog signal represented by the 1-bit pulse train, the asymmetric component needs to be extracted from the 1-bit pulse train. For this purpose, first, the waveform of the 1-bit pulse train is observed by means of an oscilloscope, and an eye pattern thereof is obtained. Then, the asymmetric component is extracted from the rising waveform and the falling waveform in the obtained eye pattern.

However, in order to observe an eye pattern of a 1-bit pulse train of about 1 Gbps, the sampling frequency of the sampling oscilloscope needs to be set to several GHz.

On the other hand, since the analog signal included in the 1-bit pulse train has a bandwidth of several tens of MHz, noise due to the bandwidth of several GHz is included in the eye pattern.

Figure 9:
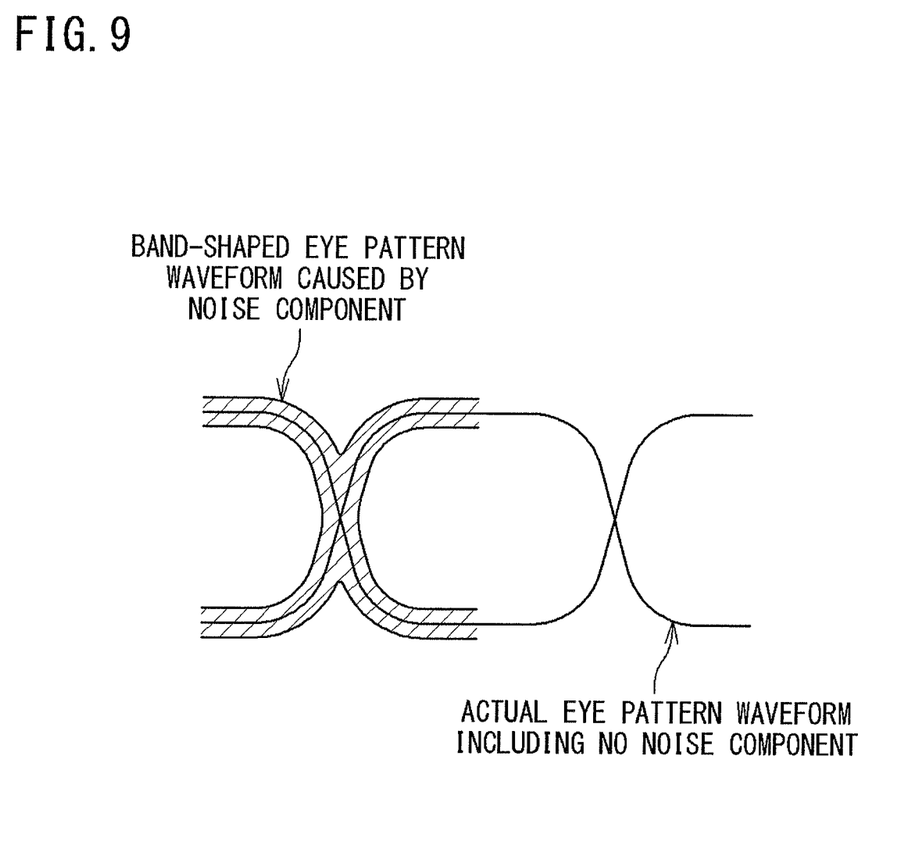
FIG. 9 shows an example of an eye pattern including a noise component.

For example, as shown in FIG. 9, the eye pattern which is originally to be observed as a linear waveform is observed in a band shape due to the noise component, and the actual waveform of the eye pattern cannot be accurately identified. As a result, the asymmetric component cannot be accurately extracted.

As described above, the noise included in the eye pattern in the process of observing the eye pattern makes accurate extraction of the asymmetric component difficult.

First, the contents of the embodiment of the present invention will be listed and described.

(1) The present embodiment relates to a method of manufacturing a distortion compensation apparatus configured to perform distortion compensation on a signal conversion device which converts an input signal into a 1-bit pulse train. The 1-bit pulse train has a pulse rising waveform and a pulse falling waveform. The pulse rising waveform has a first distortion component with respect to an ideal pulse rising waveform, and the pulse falling waveform has a second distortion component with respect to an ideal pulse falling waveform. The method includes: an acquisition step of acquiring an asymmetric component which makes the first distortion component and the second distortion component, included in the 1-bit pulse train, asymmetrical with respect to a time axis, on the basis of the input signal, and an output signal obtained from the 1-bit pulse train outputted from the signal conversion device; and a storage step of causing the distortion compensation apparatus that performs distortion compensation on the basis of the asymmetric component to store therein the asymmetric component acquired in the acquisition step. The input signal is modulated and then converted into the 1-bit pulse train by the signal conversion device. In the acquisition step, a difference between an output baseband signal obtained by demodulating the output signal and an input baseband signal which is the input signal before being modulated is acquired as the asymmetric component.

According to the method of manufacturing a distortion compensation apparatus configured as described above, since the difference between the output baseband signal obtained by demodulating the output signal and the input baseband signal which is the input signal before being modulated is acquired as the asymmetric component, the asymmetric component can be accurately acquired.

Further, since the distortion compensation apparatus is caused to store the accurately acquired asymmetric component therein, the distortion compensation apparatus can perform distortion compensation with high accuracy.

As a result, a distortion compensation apparatus can be obtained which is capable of effectively suppressing degradation in signal characteristics as an analog signal represented by the 1-bit pulse train.

(2) In the above manufacturing method, in the acquisition step, from a predetermined bandwidth, in a band of the 1-bit pulse train, which includes a signal band including a signal component of the input signal, the asymmetric component is preferably acquired for each of partial bands within the predetermined bandwidth by using a band-pass filter capable of acquiring components of the partial bands within the predetermined bandwidth. The asymmetric component is preferably acquired for each of the partial bands while adjusting a center frequency of the band-pass filter, thereby to acquire the asymmetric component from the entirety of the predetermined bandwidth.

(3) In the acquisition step, by using a band-pass filter capable of acquiring a component of a partial band within a band of the 1-bit pulse train, a signal component included in the partial band within the band of the 1-bit pulse train may be acquired, thereby to acquire an asymmetric component included in the partial band. An asymmetric component included in a band outside the partial band may be estimated on the basis of the asymmetric component included in the partial band.

In this case, since the asymmetric component outside the partial band is estimated on the basis of the asymmetric component included in the partial band, a wide-band asymmetric component can be easily acquired.

(4) More specifically, the estimation of the asymmetric component included in the band outside the partial band may utilize a time-domain convolution process using the asymmetric component included in the partial band, and the signal component included in the partial band. Thus, a wide-band asymmetric component can be acquired.

[Details of Embodiments of the Present Invention]

Hereinafter, preferred embodiments will be described with reference to the drawings.

It is noted that at least some parts of the embodiments described below may be combined together as desired.

[1. Overall Configuration of System]

Figure 1:
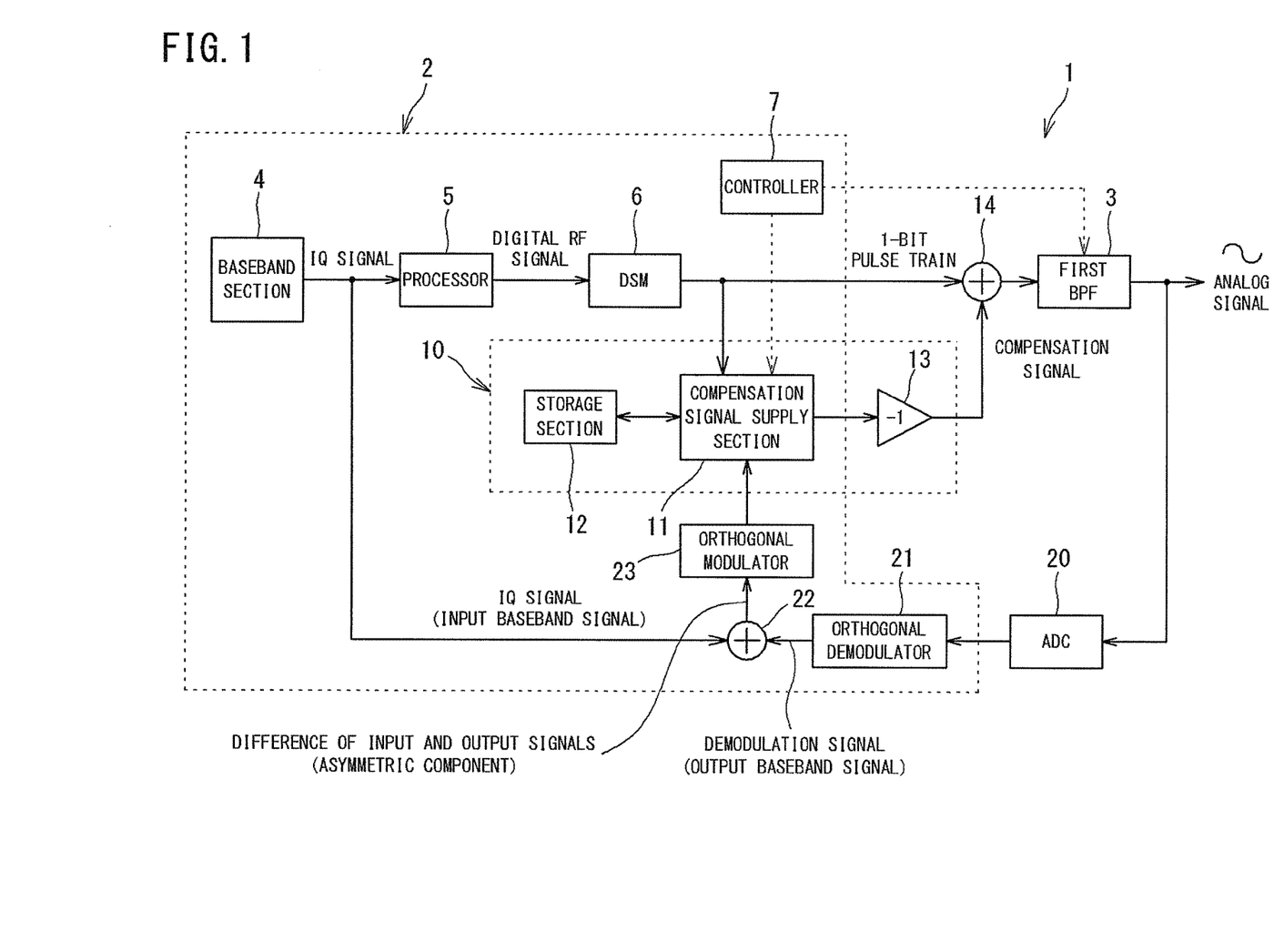
FIG. 1 is a block diagram showing a system which outputs an RF signal represented by a 1-bit pulse train.

FIG. 1 is a block diagram of a system which outputs an RF (Radio Frequency) signal represented by a 1-bit pulse train. In FIG. 1, the system 1 includes a digital signal processor 2, and a first band-pass filter (first BPF) 3 which is an analog band-pass filter.

The digital signal processor 2 outputs a signal composed of a 1-bit pulse train that represents an RF signal to be outputted, which is a signal having a predetermined radio frequency. The RF signal is a signal to be emitted as a radio wave into space, and is, for example, an RF signal for mobile communication or an RF signal for broadcast services such as television, radio, and the like.

The 1-bit pulse train outputted from the digital signal processor 2 is provided to the first BPF 3. The first BPF 3 outputs the provided 1-bit pulse train as an analog signal (output signal).

The 1-bit pulse train includes, in addition to a signal component existing in the frequency band of the RF signal, a noise component in a band other than the frequency band of the RF signal.

In the case where the passband width of the first BPF 3 is set so as to include the frequency band of the RF signal, the first BPF 3 allows the RF signal to pass therethrough, and prevents the noise component from passing therethrough. Therefore, in this case, the first BPF 3 to which the 1-bit pulse train is provided outputs an analog RF signal.

In this way, the digital signal processor 2 can substantially generate the RF signal by generating the 1-bit pulse train in digital signal processing.

On the other hand, in the case where the passband of the first BPF 3 is set to a band outside the frequency band of the RF signal, the first BPF 3 to which the 1-bit pulse train is provided outputs the noise component as an analog signal.

The digital signal processor 2 includes a baseband section 4 that outputs a baseband signal (IQ signal), a processor 5 that performs processing necessary for the baseband signal, and a delta-sigma modulator (DSM) 6.

The baseband section 4 outputs an IQ signal (each of an I signal and a Q signal) as digital data to be provided to the processor 5.

The processor 5 subjects the IQ signal provided from the baseband section 4 to processing such as digital orthogonal modulation, and outputs an RF signal in a digital signal form (digital RF signal).

The processor 5 provides the digital RF signal to the DSM 6. That is, the IQ signal is orthogonally modulated to the digital RF signal and then is provided to the DSM 6, and the IQ signal and the digital RF signal obtained by orthogonally modulating the IQ signal are components of an input signal provided to the DSM 6.

The DSM 6 forms a bandpass type delta-sigma modulator, and performs delta-sigma modulation on the digital RF signal provided from the processor 5 to output a 1-bit quantized signal (1-bit pulse train). The 1-bit pulse train outputted from the DSM 6 is a digital signal, but represents an analog RF signal.

That is, the DSM 6 forms a signal conversion device that converts the digital RF signal as the input signal into the 1-bit pulse train, and outputs the 1-bit pulse train.

The DSM 6 provides the 1-bit quantized signal (1-bit pulse train) to the first BPF 3. Thereby, the 1-bit pulse train passes through the first BPF 3 and becomes an analog signal (output signal).

The system 1 according to the present embodiment further includes a distortion compensator 10 that performs distortion compensation on the output from the DSM 6, and a controller 7 that controls the distortion compensator 10.

The distortion compensator 10 has the function of suppressing an asymmetric component which is a distortion component included in the waveform of the 1-bit pulse train, as described later.

The controller 7 has the function of, by controlling the distortion compensator 10, selectively switching the operation mode between a normal mode for causing the distortion compensator 10 to perform distortion compensation on the 1-bit pulse train, and an asymmetric component acquisition mode for causing the distortion compensator 10 to acquire an asymmetric component (described later) to be used for distortion compensation.

Further, the controller 7 is capable of controlling the distortion compensator 10 and the respective sections of the digital signal processor 2 in order to execute the above modes, and is capable of controlling the center frequency of the first BPF 3.

The distortion compensator 10 and the controller 7 will be described later in detail.

[2. Distortion component included in waveform of 1-bit pulse train]

Figure 2A:
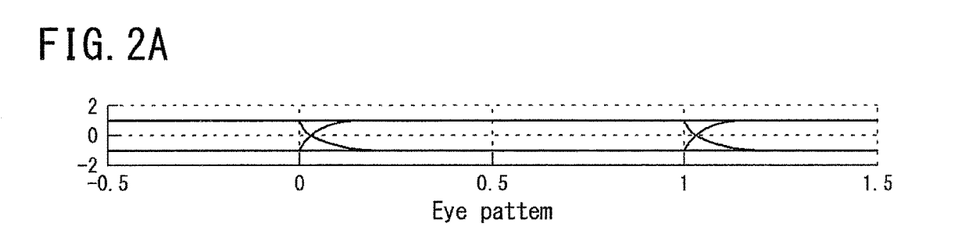
FIG. 2A shows an eye pattern of a pulse waveform (symmetric waveform),of a 1-bit pulse train outputted from a delta-sigma modulator.
Figure 2B:
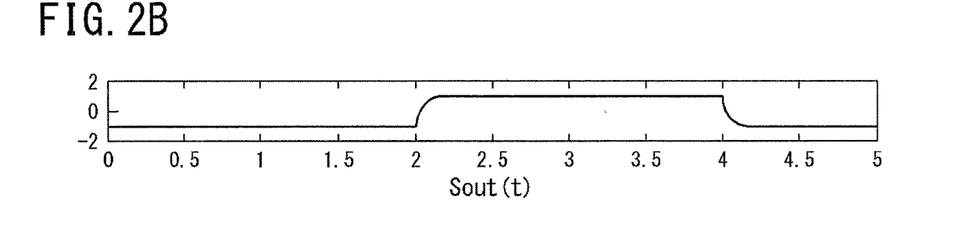
FIG. 2B shows a time axis waveform of this pulse waveform $S_{out}(t)$.

FIGS. 2A and 2B show an example of a pulse waveform of the 1-bit pulse train outputted from the DSM 6. FIG. 2A shows an eye pattern thereof, and FIG. 2B shows a time axis waveform of the pulse waveform $S_{out}(t)$.

The pulse waveform shown in FIGS. 2A and 2B are line-symmetric with respect to the time axis as shown by the eye pattern and the time axis waveform. Hereinafter, the pulse waveform line-symmetric with respect to the time axis is also referred to as a symmetric waveform. A pulse waveform line-asymmetric with respect to the time axis is also referred to as an asymmetric waveform.

It is assumed that the time axis is in the middle (0) between Low level (−1) and High level (+1) of the pulse (the same applies hereinafter).

Figure 2C:
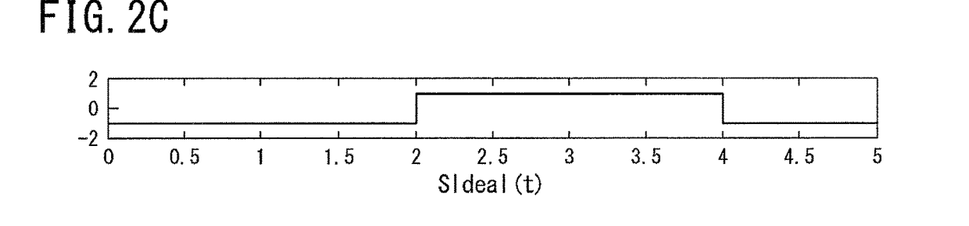
FIG. 2C shows an ideal pulse waveform $S_{Ideal}(t)$ with respect to the symmetric waveform.

FIG. 2C shows an ideal pulse waveform $S_{ideal}(t)$ with respect to the symmetric waveform. The ideal pulse waveform is a waveform when a perfect square wave is formed. An ideal pulse rising waveform indicates a waveform substantially the same as a rising waveform when a perfect square wave is formed. An ideal pulse falling waveform indicates a waveform substantially the same as a falling waveform when a perfect square wave is formed.

Assuming that the rising waveform and the falling waveform of the pulse waveform are $f_{rise}(t)$ and $f_{fall}(t)$, respectively, $f_{rise}(t)$ and $f_{fall}(t)$ each can be decomposed to a symmetric component $f_{sym}(t)$ and an asymmetric component $f_{Asym}(t)$ as shown in formulae (1) and (2).

$$f_{rise}(t) = f_{Asym}(t) + f_{sym}(t) \tag{1}$$

$$f_{fall}(t) = f_{Asym}(t) - f_{sym}(t) \tag{2}$$

On the basis of the above formulae (1) and (2), the asymmetric component $f_{Asym}(t)$ can be expressed by the following formula (3).

[Math. 1]

$$f_{Asym}(t) = \frac{f_{rise}(t) + f_{fall}(t)}{2} \tag{3}$$

Formula (3) indicates that the asymmetric component $f_{Asym}(t)$ is eliminated when the rising waveform $f_{rise}(t)$ and the falling waveform $f_{fall}(t)$ satisfy the relationship of the following formula (4).

$$f_{rise}(t) = -f_{fall}(t) \qquad (4)$$

When formula (4) is satisfied, the rising waveform $f_{rise}(t)$ and the falling waveform $f_{fall}(t)$ are line-symmetric with respect to the time axis. That is, when the pulse waveform that satisfies formula (4) is shown as an eye pattern, this eye pattern is line-symmetric with respect to the time axis.

Figure 2D:
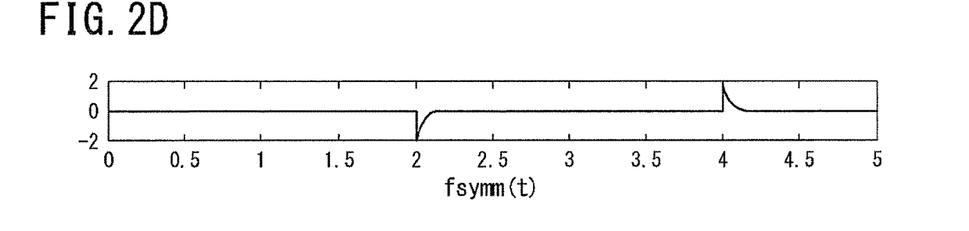
FIG. 2D shows an symmetric component $f_{sym}(t)$ in a rising waveform $f_{rise}(t)$ and a falling waveform $f_{fall}(t)$ in the symmetric waveform.
Figure 2E:
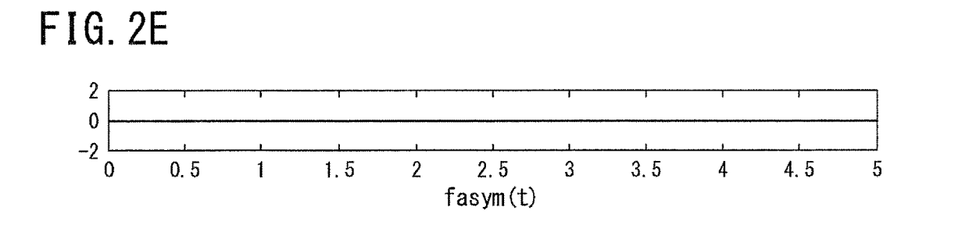
FIG. 2E shows an asymmetric component $f_{Asym}(t)$ in the rising waveform $f_{rise}(t)$ and the falling waveform $f_{fall}(t)$ in the symmetric waveform.

FIG. 2D shows the symmetric component $f_{sym}(t)$ in the rising waveform $f_{rise}(t)$ and the falling waveform $f_{fall}(t)$ in the symmetric waveform, and FIG. 2E shows the asymmetric component $f_{Asym}(t)$ in the rising waveform $f_{rise}(t)$ and the falling waveform $f_{fall}(t)$ in the symmetric waveform.

As shown in FIG. 2B, the symmetric waveform is distorted with respect to the ideal waveform $S_{Ideal}(t)$, and has a distortion component in each of the pulse rising waveform $f_{rise}(t)$ and the pulse falling waveform $f_{fall}(t)$.

When formula (4) is satisfied, the distortion component includes the symmetric component $f_{sym}(t)$ (refer to FIG. 2D) but does not include the asymmetric component $f_{Asym}(t)$ (refer to FIG. 2E).

In the symmetric waveform, when the rising waveform $f_{rise}(t)$ and the falling waveform $f_{fall}(t)$ are overlapped with each other such that a rising start point and a falling start point coincide with each other on the time axis, like the eye pattern, the rising waveform $f_{rise}(t)$ and the falling waveform $f_{fall}(t)$ become line-symmetric with respect to the time axis because the transition time (rising time) of the rising waveform $f_{rise}(t)$ is equal to the transition time (falling time) of the falling waveform $f_{fall}(t)$.

In other words, the distortion component (first distortion component) in the rising waveform $f_{rise}(t)$ and the distortion component (second distortion component) in the falling waveform $f_{fall}(t)$ are line-symmetric with respect to the time axis, and the asymmetric component $f_{Asym}(t)$ is zero.

Figure 3A:
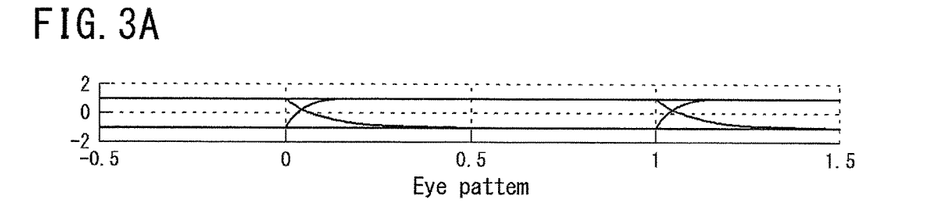
FIG. 3A shows an eye pattern of an asymmetric waveform $S_{out}(t)$.
Figure 3B:
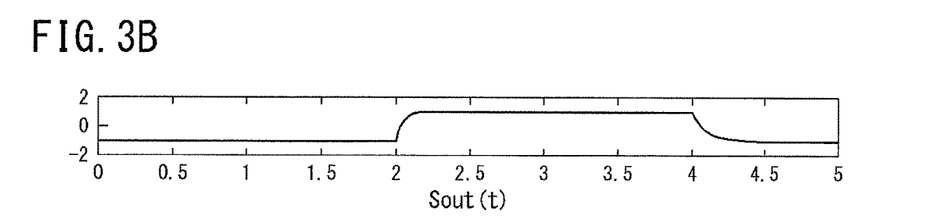
FIG. 3B shows a time axis waveform of the asymmetric waveform $S_{out}(t)$.

FIGS. 3A and 3B shows a pulse waveform (asymmetric waveform) that does not satisfy formula (4). FIG. 3A shows an eye pattern of an asymmetric waveform $S_{out}(t)$. This eye pattern is asymmetric with respect to the time axis. Specifically, in the asymmetric waveform shown in FIGS. 3A and 3B, the pulse falling time is longer than the pulse rising time.

Figure 3C:
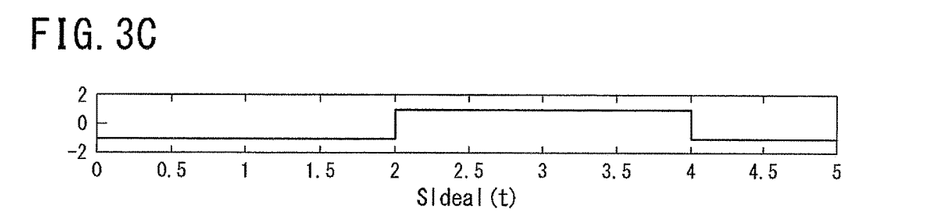
FIG. 3C shows an ideal waveform $S_{Ideal}(t)$ with respect to a symmetric waveform.
Figure 3D:
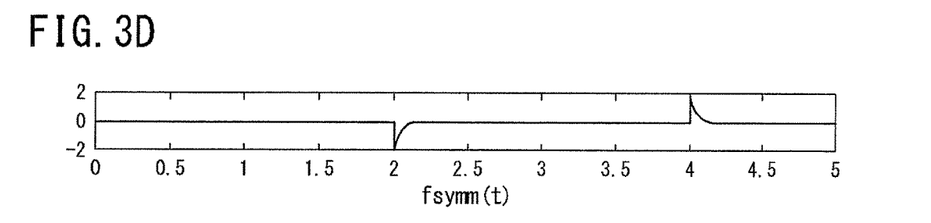
FIG. 3D shows a symmetric component $f_{sym}(t)$ in a rising waveform $f_{rise}(t)$ and a falling waveform $f_{fall}(t)$ in the asymmetric waveform.
Figure 3E:
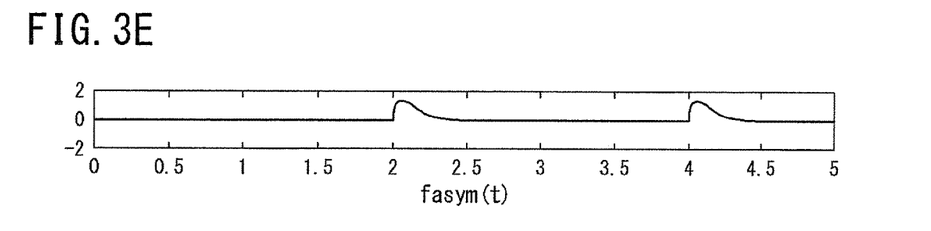
FIG. 3E shows an asymmetric component $f_{Asym}(t)$ in the rising waveform $f_{rise}(t)$ and the falling waveform $f_{fall}(t)$ in the asymmetric waveform.

FIG. 3B shows a time axis waveform of the asymmetric waveform $S_{out}(t)$, FIG. 3C shows an ideal waveform $S_{Ideal}(t)$ with respect to the symmetric waveform, FIG. 3D shows a symmetric component $f_{sym}(t)$ in the rising waveform $f_{rise}(t)$ and the falling waveform $f_{fall}(t)$ in the asymmetric waveform, and FIG. 3E shows an asymmetric component $f_{Asym}(t)$ in the rising waveform $f_{rise}(t)$ and the falling waveform $f_{fall}(t)$ in the asymmetric waveform.

As shown in FIG. 3B, the asymmetric waveform is also distorted with respect to the ideal waveform $S_{Ideal}(t)$, and has a distortion component in each of the pulse rising waveform $f_{rise}(t)$ and the pulse falling waveform $f_{fall}(t)$.

When formula (4) is not satisfied, the distortion component includes the symmetric component $f_{sym}(t)$ and the asymmetric component $f_{Asym}(t)$ (refer to FIG. 3D and FIG. 3E).

As described above, the asymmetric component $f_{Asym}(t)$ is a component that makes the distortion component (first distortion component) in the rising waveform $f_{rise}(t)$ of the 1-bit pulse train and the distortion component (second distortion component) in the falling waveform $f_{fall}(t)$ of the 1-bit pulse train, asymmetrical with respect to the time axis.

The asymmetric component $f_{Asym}(t)$ included in the pulse waveform of the 1-bit pulse train is suppressed by the compensation signal provided from the distortion compensator 10.

[3. Distortion Compensator]

[3.1 Configuration of Distortion Compensator]

Referring back to FIG. 1, the distortion compensator 10 according to the present embodiment has the function of suppressing the asymmetric component $f_{Asym}(t)$ that is a distortion component included in the waveform of the 1-bit pulse train outputted from the DSM 6, as described above. The distortion compensator 10 is configured to perform distortion compensation on the 1-bit pulse train so as to make the pulse waveform of the 1-bit pulse train symmetrical with respect to the time axis, by suppressing the asymmetric component $f_{Asym}(t)$ as the distortion component included in the waveform of the 1-bit pulse train.

The distortion compensator 10 includes a compensation signal supply section 11, and a storage section 12.

The compensation signal supply section 11 has the function of outputting a compensation signal (compensation component) used for compensation of the asymmetric component included in the 1-bit pulse train outputted from (the DSM 6 of) the digital signal processor 2.

The 1-bit pulse train outputted from the DSM 6 is provided to the compensation signal supply section 11.

Asymmetric component data indicating the asymmetric component acquired in the aforementioned asymmetric component acquisition mode is stored in the storage section 12.

The compensation signal supply section 11 outputs the compensation signal on the basis of the asymmetric component data stored in the storage section 12 and the 1-bit pulse train provided from the DSM 6.

More specifically, upon receiving the 1-bit pulse train provided from the DSM 6, the compensation signal supply section 11 outputs the asymmetric component as the compensation signal in accordance with the timing of rising or falling of the waveform of the 1-bit pulse train.

The compensation signal as the asymmetric component is provided to the 1-bit pulse train via an inverting amplifier 13, and cancels out the asymmetric component included in the 1-bit pulse train, thereby suppressing the asymmetric component.

The compensation signal supply section 11 provides the compensation signal to an adder 14 via the inverting amplifier 13 disposed between the compensation signal supply section 11 and the adder 14.

Thus, in the 1-bit pulse train outputted from the DSM 6, the asymmetric component thereof is suppressed by the compensation signal added thereto, whereby the asymmetric component as a distortion is compensated for.

Thereafter, the 1-bit pulse train to which the compensation signal is added passes through the first BPF 3 and is outputted as an analog signal.

[3.2 Acquisition of Asymmetric Component]

The asymmetric component used for obtaining the compensation signal is acquired by the compensation signal supply section 11 when the controller 7 selects the asymmetric component acquisition mode, as described above.

Hereinafter, the process of acquiring the asymmetric component by the compensation signal supply section 11 will be described.

First, the controller 7 determines which one of the operation modes is to be selected, between the normal mode for causing the distortion compensator 10 to perform distortion compensation of the 1-bit pulse train, and the asymmetric component acquisition mode for causing the compensation signal supply section 11 to acquire the asymmetric component.

When the normal mode is selected, the controller 7 causes the compensation signal supply section 11 to acquire the 1-bit pulse train outputted from the DSM 6, and causes the compensation signal supply section 11 to output the compensation signal on the basis of the asymmetric component data stored in the storage section 12 and the 1-bit pulse train provided from the DSM 6. The compensation signal supply section 11 provides the compensation signal to the adder 14, and the adder 14 adds the compensation signal to the 1-bit pulse train outputted from the DSM 6. Thus, in the 1-bit pulse train outputted from the DSM 6, the asymmetric component is suppressed, i.e., the asymmetric component is compensated for.

On the other hand, when the asymmetric component acquisition mode is selected, the controller 7 causes the baseband section 4, the processor 5, and the DSM 6 to output a test signal that has been set in advance in order to acquire the asymmetric component. Thereby, the DSM 6 outputs the 1-bit pulse train according to the test signal.

In the case where the controller 7 selects the asymmetric component acquisition mode, the controller 7 causes the compensation signal supply section 11 to suspend calculation and outputting of the compensation signal.

The 1-bit pulse train according to the test signal outputted from the DSM 6 passes through the first BPF 3 to become a band-limited analog signal. Therefore, the system 1 outputs the analog signal as an output signal.

Furthermore, the controller 7 causes the system 1 to output the analog signal, and then causes the compensation signal supply section 11 to acquire a difference between a demodulation signal (output baseband signal) obtained by demodulating the analog signal to be outputted from the system 1, and the IQ signal (input baseband signal) outputted from the baseband section 4 (acquisition process).

In other words, the controller 7 causes the compensation signal supply section 11 to acquire a difference between the demodulation signal obtained by orthogonally demodulating the analog signal as an output signal which is obtained by limiting the band of the 1-bit pulse train outputted from the DSM 6, and the IQ signal, which has not yet been orthogonally modulated, of the digital RF signal to be provided to the DSM 6.

The system 1 includes an analog/digital converter (ADC) 20 to which the analog signal outputted from the system 1 is provided, an orthogonal demodulator 21, an adder 22, and an orthogonal modulator 23.

The ADC 20 converts the analog signal outputted from the system 1 into a digital signal, and provides the digital signal to the orthogonal demodulator 21.

The orthogonal demodulator 21 outputs a demodulation signal (output baseband signal) obtained by orthogonally demodulating the digital signal provided from the ADC 20. The orthogonal demodulator 21 provides the demodulation signal to the adder 22.

The adder 22 receives, in addition to the demodulation signal outputted from the orthogonal demodulator 21, the IQ signal (input baseband signal), which has not yet been orthogonally modulated, of the digital RF signal to be provided to the DSM 6.

The adder 22 calculates a difference between the demodulation signal and the IQ signal. The difference calculated by the adder 22 is provided to the orthogonal modulator 23.

The orthogonal modulator 23 orthogonally modulates the difference between the demodulation signal and the IQ signal, and provides the resultant signal to the compensation signal supply section 11.

Thus, the controller 7 can cause the compensation signal supply section 11 to acquire the difference between the demodulation signal obtained by orthogonally demodulating the analog output signal obtained from the 1-bit pulse train outputted from the DSM 6, and the IQ signal, which has not yet been orthogonally modulated, of the digital RF signal to be provided to the DSM 6.

Meanwhile, the difference between the demodulation signal (output baseband signal) and the IQ signal (input baseband signal) is considered to be an asymmetric component. If the demodulation signal coincides with the IQ signal, the system 1 outputs the RF signal without degrading the signal characteristics. In other words, the difference between the demodulation signal and the IQ signal is a component that degrades the signal characteristics of the RF signal, and is considered to be an asymmetric component.

Therefore, the compensation signal supply section 11 according to the present embodiment acquires the difference between the demodulation signal and the IQ signal, as an asymmetric component.

As described above, the controller 7 causes the compensation signal supply section 11 to acquire the asymmetric component.

The controller 7 is able to adjust a center frequency $f_0$ of the first BPF 3. By adjusting the center frequency $f_0$ of the first BPF 3, the controller 7 acquires an asymmetric component from a predetermined bandwidth within the band of the 1-bit pulse train.

Figure 4:
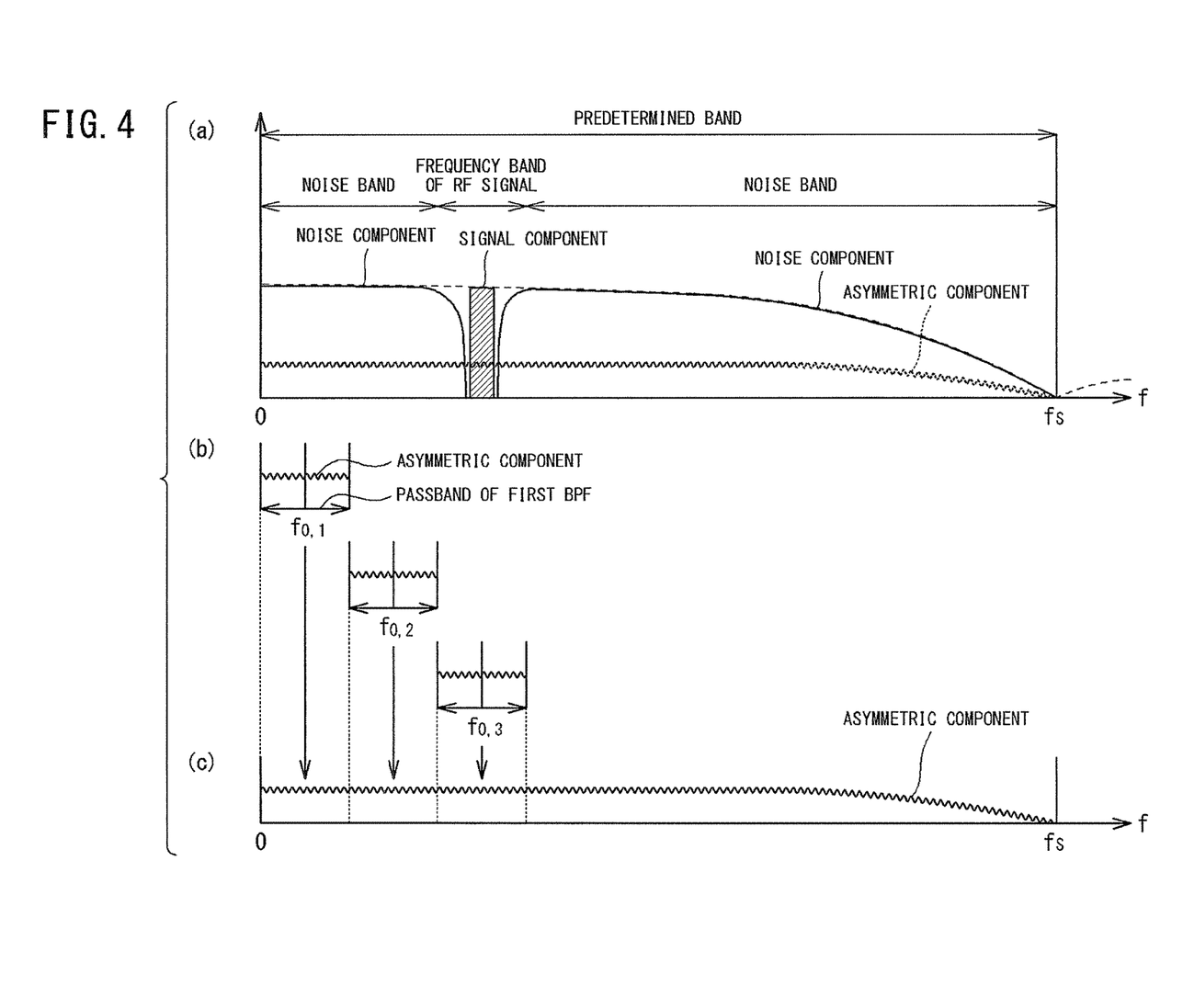
FIG. 4, shows a manner of executing an asymmetric component acquiring process.

In FIG. 4, (a) shows an example of a frequency spectrum of the 1-bit pulse train outputted from the digital signal processor 2. In (a) of FIG. 4, fs denotes a sampling frequency of the DSM 6, and a notch at which the component intensity becomes zero is generated at the sampling frequency fs.

As shown in (a) of FIG. 4, the 1-bit pulse train includes, in addition to the signal component existing in the frequency band of the RF signal, a noise component in a band (noise bands) outside the frequency band of the RF signal.

The 1-bit pulse train also includes an asymmetric component in the band thereof.

As shown in (a) of FIG. 4, in the band from the frequency of 0 to the notch, the 1-bit pulse train includes a signal component of the RF signal obtained by modulating the input signal.

In the present embodiment, the controller 7 regards the band from the frequency of 0 to the notch, as the predetermined bandwidth that includes a signal band including the signal component of the input signal in the band of the 1-bit pulse train, and acquires the asymmetric component from the predetermined band from the frequency of 0 to the notch.

For example, the passband of the first BPF 3 is set to about 3 to 5 times the frequency bandwidth of the RF signal. Therefore, assuming that the frequency bandwidth of the RF signal is 10 MHz, the passband width of the first BPF 3 is set to about 30 to 50 MHz.

Assuming that the sampling frequency fs of the DSM 6 is 1 GHz, the first BPF 3 can acquire a component of a partial band within the predetermined bandwidth, and the compensation signal supply section 11 can execute acquisition of the asymmetric component for each passband of the first BPF 3.

The controller 7 causes the compensation signal supply section 11 to execute the asymmetric component acquiring process for each passband of the first BPF 3 while adjusting the center frequency of the first BPF 3.

FIG. 4, (b) shows the manner of executing the asymmetric component acquiring process while adjusting the center frequency of the first BPF 3.

As shown in (b) of FIG. 4, the controller 7 adjusts the center frequency $f_0$ of the first BPF 3 to $f_{0,1}$, $f_{0,2}$, and $f_{0,3}$ in order, thereby to successively shift the passband of the first BPF 3, and acquires the asymmetric component included in the passband each time the passband is shifted.

The controller 7 alternately repeats the adjustment of the passband of the first BPF 3 and the acquisition of the asymmetric component, thereby to acquire the asymmetric components from the entirety of the predetermined bandwidth.

It is noted that the shift amount of the passband of the first BPF 3 is set such that the passband before shifting and the passband after shifting appropriately overlap each other. Thus, the asymmetric component can be acquired without omission before and after shifting of the passband.

After the asymmetric component corresponding to each passband of the first BPF 3 has been acquired from the predetermined bandwidth, the compensation signal supply section 11, as shown in (c) of FIG. 4, can acquire the asymmetric component over the entirety of the predetermined bandwidth by using the acquired asymmetric component of each passband of the first BPF 3.

After the acquisition of the asymmetric component over the entirety of the predetermined band has ended, the controller 7 causes the compensation signal supply section 11 to store, in the storage section 12, the asymmetric component acquired by the compensation signal supply section 11 as the asymmetric component data.

Thus, the controller 7 ends the process relating to the asymmetric component acquisition mode, and goes to the normal mode.

It is noted that the controller 7 determines to select the asymmetric component acquisition mode during test operation before actual use of the system 1.

Therefore, when the system 1 is used, the controller 7 selects the normal mode with the asymmetric component data being stored in the storage section 12, and causes the distortion compensator 10 to execute the distortion compensation.

[4. Effects]

According to the present embodiment, the asymmetric component included in the 1-bit pulse train is acquired on the basis of the analog signal as an output signal which is obtained from the 1-bit pulse train outputted from the DSM 6, and the IQ signal as input signal to be inputted to the DSM 6 (acquisition process), and the distortion compensator 10 (distortion compensation apparatus) that performs distortion compensation on the basis of the asymmetric component is caused to store therein the acquired asymmetric component (storage process). Thus, the distortion compensator 10 is able to execute distortion compensation.

When acquiring the asymmetric component, the compensation signal supply section 11 in the distortion compensator 10 acquires, as an asymmetric component, a difference between the demodulation signal (output baseband signal) obtained by orthogonally demodulating the analog signal as the output signal, and the IQ signal (input baseband signal) which has not yet been orthogonally modulated. Thus, the asymmetric component can be accurately acquired.

Further, since the accurately acquired asymmetric component is stored in the storage section 12, the distortion compensator 10 can perform distortion compensation with high accuracy.

As a result, it is possible to provide the distortion compensator 10 capable of effectively suppressing degradation in signal characteristics as the analog signal represented by the 1-bit pulse train.

Further, in the present embodiment, since the asymmetric component is acquired over the wide band within the band of the 1-bit pulse train outputted from the DSM 6, it is possible to appropriately perform distortion compensation regardless of the frequency band of the RF signal.

In the above embodiment, an exemplary case has been described in which the controller 7 selects the asymmetric component acquisition mode during the test operation before the actual use of the system 1. However, the controller 7 may be configured to determine, in the normal mode, to select the asymmetric component acquisition mode after a predetermined period of time has passed from the actual use of the system 1, and newly acquire the asymmetric component to update the asymmetric component data.

In this case, even if the asymmetric component is changed with the passage of time due to use of the system 1, the accuracy of the distortion compensation can be maintained by updating the asymmetric component data stored in the storage section 12 in accordance with the change.

Further, in the above embodiment, an exemplary case has been described in which the distortion compensator 10 includes the compensation signal supply section 11 and the storage section 12. However, the distortion compensator 10 may further include a controller 7, an ADC 20, an orthogonal demodulator 21, an adder 22, and an orthogonal modulator 23, in addition to the compensation signal supply section 11 and the storage section 12.

[5. Another Embodiment]

Figure 5:
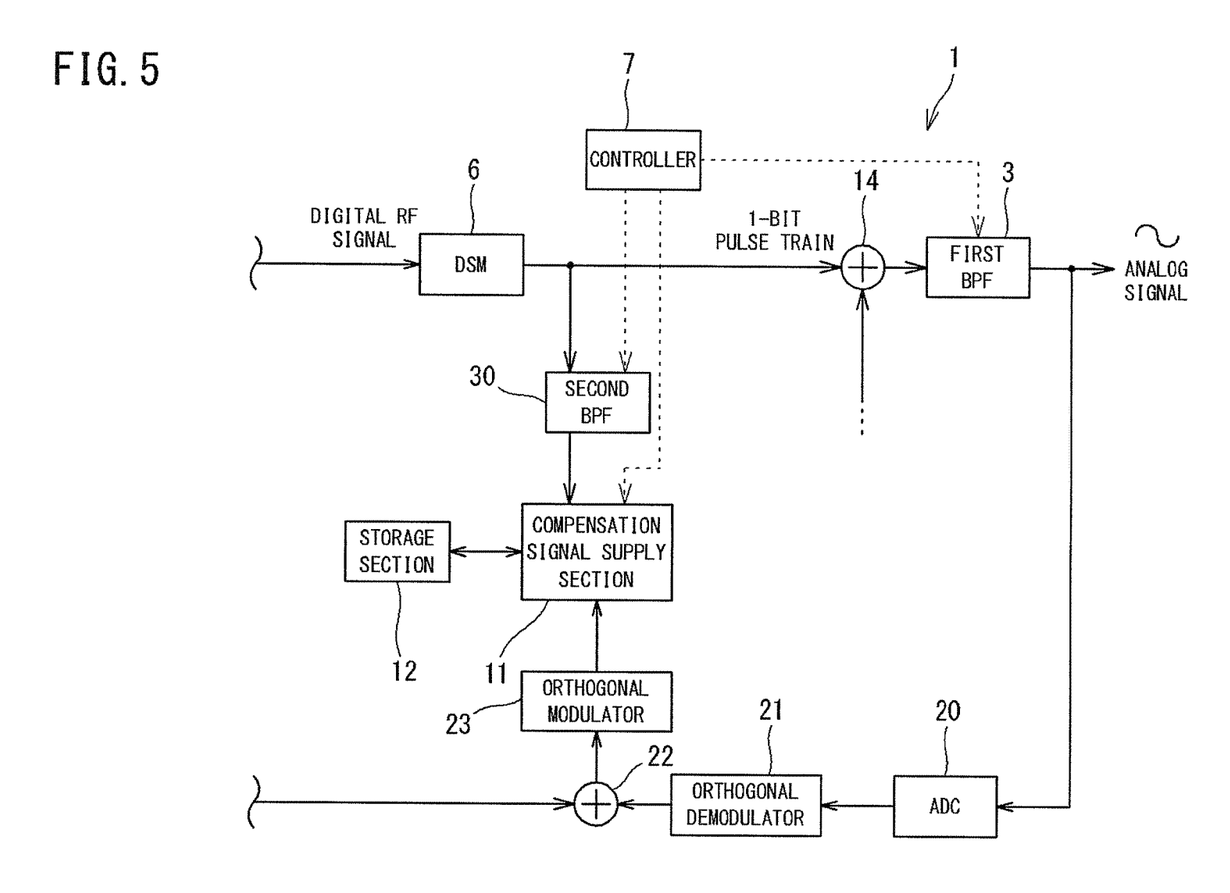
FIG. 5 is a block diagram showing the configuration of a system in an asymmetric component acquisition mode, according to another embodiment.

FIG. 5 is a block diagram showing the configuration of the system 1 in the asymmetric component acquisition mode, according to another embodiment.

In the present embodiment, when acquiring an asymmetric component, a component of a partial band within the predetermined band is acquired to acquire an asymmetric component included in the partial band, and an asymmetric component included in a band outside the partial band is estimated and acquired on the basis of the acquired asymmetric component included in the partial band.

As shown in FIG. 5, in the system 1 according to the present embodiment, a second BPF 30 is provided between the DSM 6 and the compensation signal supply section 11 in the asymmetric component acquisition mode.

The passband of the second BPF 30 is set similarly to the passband of the first BPF 3.

For example, the passbands of the first BPF 3 and the second BPF 30 are set so as to include the frequency band (the band including the signal component) of the RF signal.

When the asymmetric component acquisition mode is selected in this state, the controller 7 causes each section to output a preset test signal, and causes the DSM 6 to output the 1-bit pulse train.

The compensation signal supply section 11 acquires the asymmetric component included in the passband of the first BPF 3 on the basis of a difference between the IQ signal and the demodulation signal obtained by orthogonally demodulating the analog signal obtained after the 1-bit pulse train has passed through the first BPF 3.

In addition, the compensation signal supply section 11 acquires the signal component after the 1-bit pulse train has passed through the second BPF 30.

As described above, the compensation signal supply section 11 acquires the asymmetric component included in the partial band (the passband of the first BPF 3) within the band of the 1-bit pulse train, and the signal component included in the partial band (the passband of the second BPF 30) within the band of the 1-bit pulse train. It is noted that the passband of the first BPF 3 and the passband of the second BPF 30 are set similarly to each other, and each of the passbands of the first BPF 3 and the second BPF 30 is also referred to as a predetermined passband, hereinafter. The asymmetric component and the signal component acquired by the compensation signal supply section 11 are the components included in the predetermined passband.

Next, the compensation signal supply section 11 estimates the asymmetric component included in the band outside the predetermined passband, on the basis of the asymmetric component included in the predetermined passband and the signal component included in the predetermined passband.

Now, input and output of a signal when the compensation signal supply section 11 executes distortion compensation in the normal mode will be considered.

Figure 6:
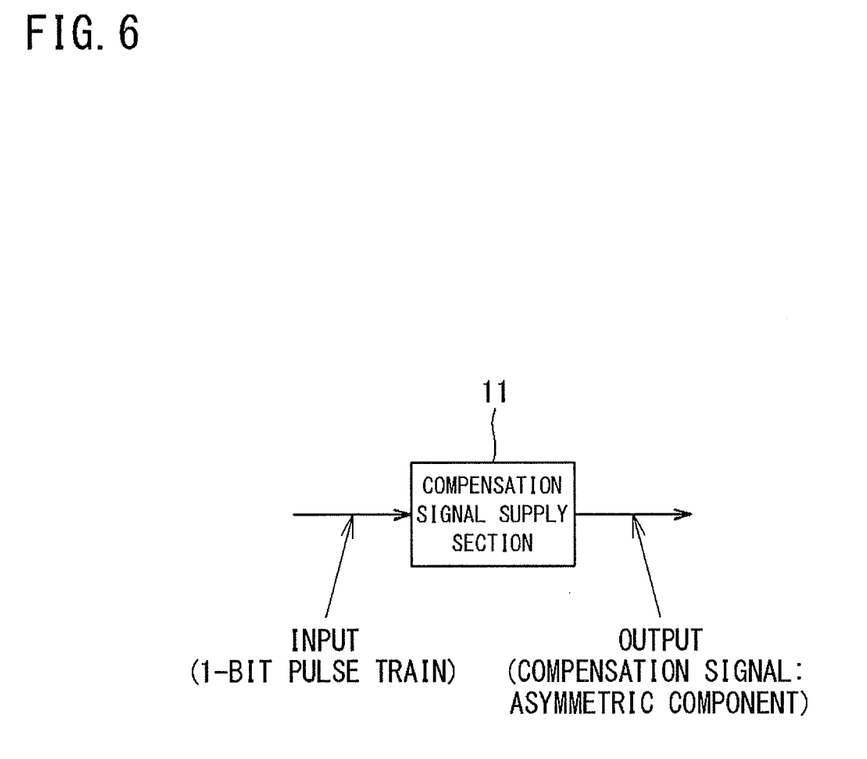
FIG. 6 shows an input-output relationship of a signal when a compensation signal supplying section executes distortion compensation in a normal mode.

FIG. 6 shows the input-output relationship of the signal when the compensation signal supply section 11 executes distortion compensation in the normal mode.

As shown in FIG. 6, when the compensation signal supply section 11 receives a 1-bit pulse train as an input, the compensation signal supply section 11 outputs an asymmetric component that is a compensation signal, as an output.

At this time, by regarding the compensation signal supply section 11 as a filter, a characteristic value, as the filter, of the compensation signal supply section 11 can be calculated on the basis of the input and the output.

Even if it is attempted to obtain the characteristic value, as the filter, of the compensation signal supply section 11, with the signal component included in the predetermined passband and the asymmetric component included in the predetermined passband, which components are acquired by the compensation signal supply section 11, being the input and the output, respectively, since the signal component included in the predetermined passband and the asymmetric component included in the predetermined passband are narrow-band signals, it is not possible to estimate a characteristic value outside the predetermined passband by processing in the frequency domain.

So, the compensation signal supply section 11 estimates an asymmetric component outside the predetermined passband on the basis of the asymmetric component in the predetermined passband by utilizing a time-domain convolution process.

The asymmetric component included in the predetermined passband, which is acquired by the compensation signal supply section 11, is regarded as an output Y (Y=$y_1$, $y_2$, . . . $y_n$), and the signal component included in the predetermined passband, which is acquired by the compensation signal supply section 11, is regarded as an input X (X=$x_1$, $x_2$, $x_3$, . . . ). It is noted that numerical values appended to the respective elements of the output Y and the input X represent numbers indicating the order of signal data constituting the discretely arranged signal components.

Assuming that the characteristic value, as the filter, of the compensation signal supply section 11 is an impulse response H (H=$h_1$, $h_2$, . . . $h_m$), the output Y and the input X are represented by time-domain convolution as shown in the following formula (5).

[Math. 2]

$$\begin{pmatrix} y_1 \\ y_2 \\ \vdots \\ y_n \end{pmatrix} = \begin{pmatrix} x_1, x_2, \ldots x_m \\ x_2, x_3, \ldots x_{m+1} \\ \vdots \end{pmatrix} \begin{pmatrix} h_1 \\ h_2 \\ \vdots \\ h_n \end{pmatrix} \quad (5)$$

It is noted that, in formula (5), m and n are natural numbers, and m indicates the length of the impulse response.

The compensation signal supply section 11 calculates a square sum c of a residual between the left side and the right side of formula (5), and calculates an impulse response H that minimizes the square sum s of the residual, as shown in the following formula (6).

[Math. 3]

$$\begin{cases} \varepsilon = \sum_{i=1}^{n} (y_i - (x_i h_i + x_{i+1} h_{i+1} + x_{i+2} h_{i+2} + \ldots x_{i+m-1} h_{i+m-1}))^2 & (6) \\ |h_j - h_{j+1}| < a & (7) \end{cases}$$

In calculating the impulse response H on the basis of the above formula (6), a condition represented by the above formula (7) should be satisfied. It is noted that j is a natural number in formula (7).

Formula (7) limits the value of the impulse response which is variable per unit time, to less than a value a. This value a corresponds to a through rate, as a filter circuit, of the compensation signal supply section 11. Provision of such a limiting condition allows the compensation signal supply section 11 to appropriately calculate the impulse response H.

The compensation signal supply section 11 can obtain the asymmetric component included in the band outside the predetermined passband, on the basis of the calculated impulse response H, and the 1-bit pulse train provided from the DSM 6.

In other words, the compensation signal supply section 11 can estimate the asymmetric component included in the band outside the predetermined passband, by calculating the impulse response H on the basis of the asymmetric component included in the predetermined passband and the signal component included in the predetermined passband.

The compensation signal supply section 11 stores, in the storage section 12, the calculated impulse response H as asymmetric component data representing the asymmetric component of the 1-bit pulse train.

Figure 7:
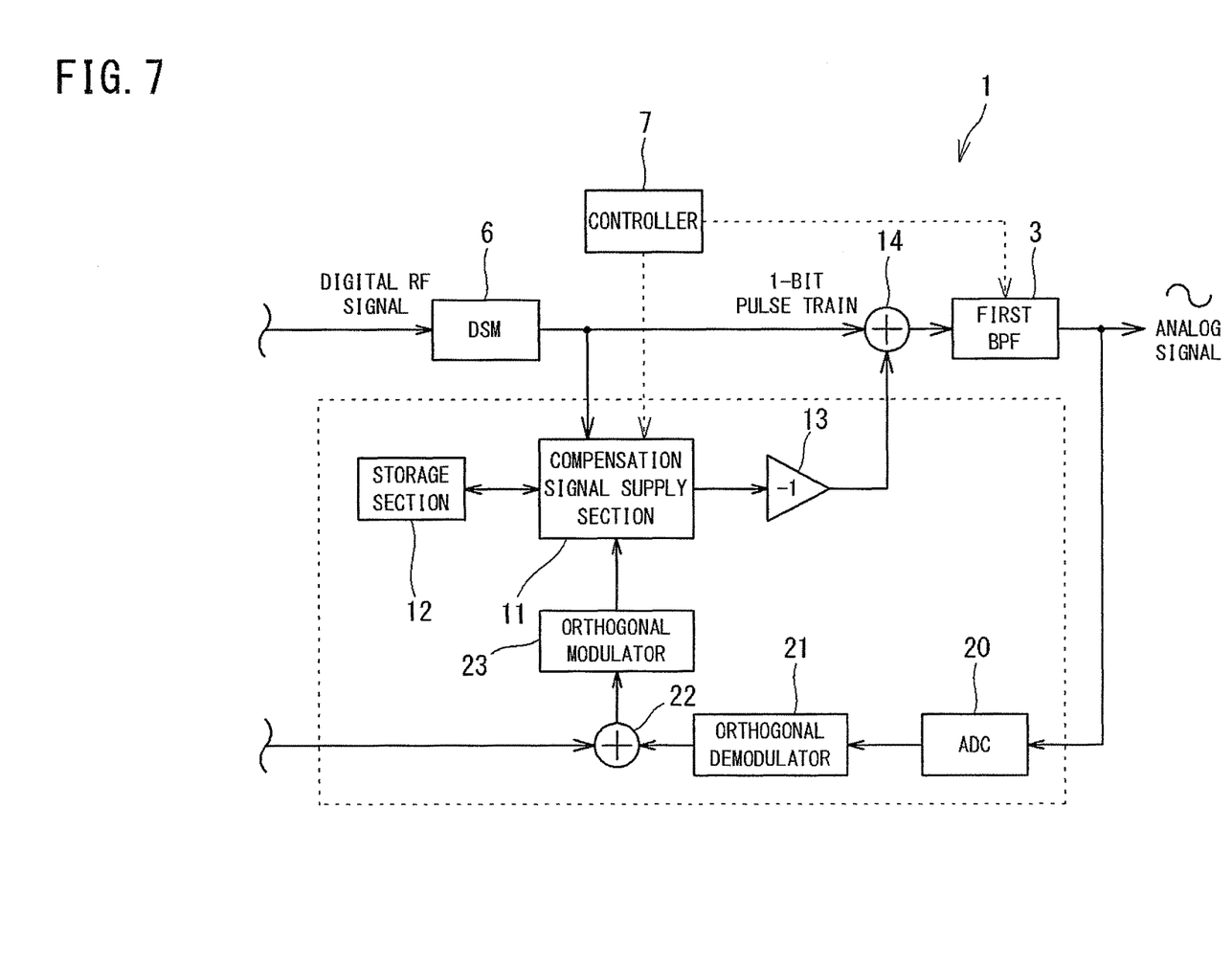
FIG. 7 is a block diagram showing the configuration of a system in the normal mode, according to another embodiment.

FIG. 7 is a block diagram showing the configuration of the system in the normal mode, according to the present embodiment.

After the impulse response H has been calculated as described above, when the controller 7 selects the normal mode, the second BPF 30 provided in FIG. 5 is eliminated as shown in FIG. 7, and the 1-bit pulse train from the DSM 6 is provided to the compensation signal supply section 11. Then, the compensation signal supply section 11 obtains the asymmetric component included in the band outside the predetermined passband on the basis of the provided 1-bit pulse train and the impulse response H stored in the storage section 12, and outputs the obtained asymmetric component in the band outside the predetermined passband together with the asymmetric component in the predetermined passband as compensation signals.

By adding the compensation signal to the 1-bit pulse train, the asymmetric component included in the 1-bit pulse train can be suppressed.

The bandwidth of the estimated asymmetric component included in the band outside the predetermined passband can be set to, for example, the aforementioned predetermined band or an arbitrary value.

As described above, in the present embodiment, the asymmetric component included in the band outside the predetermined passband can be estimated on the basis of the asymmetric component included in the predetermined passband as a partial band. Therefore, the asymmetric component over the wide band can be acquired more easily as compared to the case where, in acquiring the asymmetric component over the wide band, acquisition of the asymmetric component in each partial band is repeated to acquire the asymmetric component over the wide band.

It is noted that, when evaluating the estimation accuracy of the impulse response H calculated by the aforementioned method, distortion compensation may be executed by using a signal in another frequency band in the vicinity of the predetermined passband.

The estimation accuracy of the asymmetric component can be determined by comparing the degree of degradation in signal characteristics of the signal outputted from the system 1 at this time with the degree of degradation in signal characteristics when the signal in the predetermined passband is subjected to distortion compensation.

Figure 8:
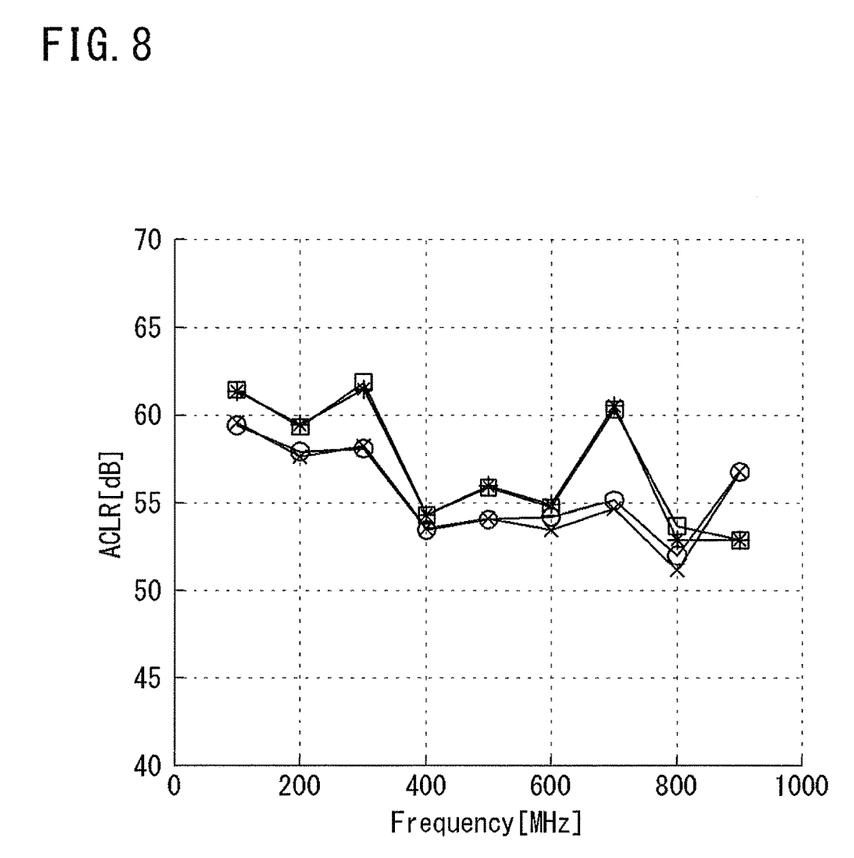
FIG. 8 is a graph showing a result of evaluation of estimation accuracy of an estimated asymmetric component.

FIG. 8 is a graph showing the result of evaluation for the estimation accuracy of the estimated asymmetric component. In FIG. 8, with the center frequency of the predetermined passband being set to 300 MHz, the asymmetric component included in the band outside the predetermined passband is estimated, distortion compensation using the estimated asymmetric component is performed on a signal of another frequency, and an ACLR at that time is calculated to evaluate the estimation accuracy.

As a result, as shown in FIG. 8, when the frequency of the signal used for the distortion compensation exceeds the center frequency (300 MHz) of the predetermined passband, the ACLR is gradually lowered, which means that the accuracy degrades a little, but the ACLR is maintained at a level of at least 50 dB.

[6. Others]

Note that the embodiment disclosed herein is merely illustrative in all aspects and should not be recognized as being restrictive. The scope of the present invention is defined by the scope of the claims rather than by the meaning described above, and is intended to include meaning equivalent to the scope of the claims and all modifications within the scope.

REFERENCE SIGNS LIST 1 system
2 digital signal processor
3 first BPF
4 baseband section
5 processor
6 delta-sigma modulator (DSM)
7 controller
10 distortion compensator
11 compensation signal supply section
12 storage section
13 inverting amplifier
14 adder
20 analog/digital converter (ADC)
21 orthogonal demodulator
22 adder
23 orthogonal modulator
30 second BPF

The invention claimed is:

1. A method of manufacturing a distortion compensation apparatus configured to perform distortion compensation on a delta-sigma modulator which converts an input signal into a 1-bit pulse train, the 1-bit pulse train having a pulse rising waveform and a pulse falling waveform, the pulse rising waveform having a first distortion component with respect to an ideal pulse rising waveform, and the pulse falling waveform having a second distortion component with respect to an ideal pulse falling waveform, the method comprising:

an acquisition step of acquiring an asymmetric component which makes the first distortion component and the second distortion component, included in the 1-bit pulse train, asymmetrical with respect to a time axis, on the basis of the input signal, and an output signal obtained from the 1-bit pulse train outputted from the delta-sigma modulator, the input signal being a signal before being converted into the 1-bit pulse train by the delta-sigma modulator; and a storage step of causing the distortion compensation apparatus that performs distortion compensation on the basis of the asymmetric component to store therein the asymmetric component acquired in the acquisition step, wherein the input signal is modulated and then converted into the 1-bit pulse train by the delta-sigma modulator, and in the acquisition step, a difference between an output baseband signal obtained by demodulating the output signal and an input baseband signal which is the input signal before being modulated is acquired as the asymmetric component.

2. The method of manufacturing the distortion compensation apparatus according to claim 1, wherein in the acquisition step, from a predetermined bandwidth, in a band of the 1-bit pulse train, which includes a signal band including a signal component of the input signal, the asymmetric component is acquired for each of partial bands within the predetermined bandwidth by using a band-pass filter capable of acquiring components of the partial bands within the predetermined bandwidth, and the asymmetric component is acquired for each of the partial bands while adjusting a center frequency of the band-pass filter, thereby to acquire the asymmetric component from the entirety of the predetermined bandwidth.

3. The method of manufacturing the distortion compensation apparatus according to claim 1, wherein in the acquisition step, by using a band-pass filter capable of acquiring a component of a partial band within a band of the 1-bit pulse train, a signal component included in the partial band within the band of the 1-bit pulse train is acquired, thereby to acquire an asymmetric component included in the partial band, and an asymmetric component included in a band outside the partial band is estimated on the basis of the asymmetric component included in the partial band.

4. The method of manufacturing the distortion compensation apparatus according to claim 3, wherein the estimation of the asymmetric component included in the band outside the partial band utilizes a time-domain convolution process using the asymmetric component included in the partial band, and the signal component included in the partial band.

5. A method of manufacturing a distortion compensation apparatus configured to perform distortion compensation on delta-sigma modulator which converts an input signal into a 1-bit pulse train, the method comprising:

an acquisition step of acquiring an asymmetric component which makes a pulse rising waveform and a pulse falling waveform, included in the 1-bit pulse train, asymmetrical with respect to a time axis, on the basis of the input signal, and an output signal obtained from the 1-bit pulse train outputted from the delta-sigma modulator, the input signal being a signal before being converted into the 1-bit pulse train by the delta-sigma modulator; and a storage step of causing the distortion compensation apparatus that performs distortion compensation on the basis of the asymmetric component to store therein the asymmetric component acquired in the acquisition step, wherein the input signal is modulated and then converted into the 1-bit pulse train by the delta-sigma modulator, and in the acquisition step, a difference between an output baseband signal obtained by demodulating the output signal and an input baseband signal which is the input signal before being modulated is acquired as the asymmetric component.

\* \* \* \* \*